US006278550B1

(12) United States Patent
Kathman et al.

(10) Patent No.: US 6,278,550 B1
(45) Date of Patent: Aug. 21, 2001

(54) BEAM HOMOGENIZER

(75) Inventors: Alan D Kathman; Michael R. Feldman, both of Charlotte, NC (US)

(73) Assignee: Digital Optics Corporation, Charlotte, NC (US)

( * ) Notice: Subject to any disclaimer, the term of this patent is extended or adjusted under 35 U.S.C. 154(b) by 0 days.

(21) Appl. No.: 09/484,050

(22) Filed: Jan. 18, 2000

Related U.S. Application Data

(63) Continuation of application No. 09/160,322, filed on Sep. 25, 1998, now Pat. No. 6,025,938, which is a continuation of application No. 08/770,524, filed on Dec. 20, 1996, now Pat. No. 5,850,300, which is a continuation-in-part of application No. 08/203,188, filed on Feb. 28, 1994, now Pat. No. 5,610,733.

(51) Int. Cl.[7] ............................................ G02B 5/02
(52) U.S. Cl. ........................... 359/599; 359/15; 355/67
(58) Field of Search ............................... 359/9, 15, 599, 359/53, 67, 71

(56) References Cited

U.S. PATENT DOCUMENTS

| 4,170,396 | 10/1979 | Kraft ........................ 359/15 |
| 4,410,237 | 10/1983 | Veldkamp ................... 359/569 |
| 4,455,061 | 6/1984 | Case ......................... 359/17 |

(List continued on next page.)

FOREIGN PATENT DOCUMENTS

| 0 580 905A1 | * 2/1994 | (EP) . |
| 0 744 664 A2 | 11/1996 | (EP) . |
| 2 716 726 | 9/1995 | (FR) . |

OTHER PUBLICATIONS

A. Vasara, et al., "Realization of General Nondiffracting Beams with Computer–Generated Holograms", J. Opt. Soc. Amer. vol. 6, No. 11, pp. 1748–1754, Nov. 1989.*
M. Dames, et al., "Efficient Optical Elements to Generate Intensity Weighted Spot Arrays: Design and Fabrication", Appl. Optics. vol. 30, No. 19, pp. 2685–2691, Jul. 1991.*
Wai–Hon Lee, "Method for Converting a Gaussian Laser Beam into a Uniform Beam", Optics Comm., vol. 36, No. 6, pp. 469–471, Mar. 1981.*
Y.H. Wu et al., "Cell–Oriented On–Axis Computer–Generated Holograms for use in the Fresnel Diffraction Mode", Applied Optics, vol. 23, No. 2, Jan. 1984.
M.A. Golub et al., "Focusing Light into a Specified volume by Computer–Synthesized Holograms", Soc. Tech. Phys. Lett., 7(5), May 1981.
Michael R. Feldman et al., "Interactive encoding of high-efficiency holograms for generationof spot arrays", May 15, 1989/vol. 14, No. 10/Optics Letters, pp. 479–481.

(List continued on next page.)

*Primary Examiner*—Cassandra Spyrou
*Assistant Examiner*—John Juba, Jr.
(74) *Attorney, Agent, or Firm*—Susan S. Morse

(57) ABSTRACT

A beam homogenizer that minimizes undesired intensity variations at the output plane caused by sharp breaks between facets in previous embodiments. The homogenizer includes a hologram made up of irregularly patterned diffractive fringes. An input beam illuminates at least part of the hologram. The hologram transmits a portion of the input beam onto an output plane. In doing so, the energy of the input beam is spatially redistributed at the output plane into a homogenized output beam having a preselected spatial energy distribution at the output plane. Thus, the illuminated portion of the output plane has a shape predetermined by the designer of the homogenizer.

5 Claims, 7 Drawing Sheets

U.S. PATENT DOCUMENTS

| | | | |
|---|---|---|---|
| 4,547,037 | 10/1985 | Case | 359/15 |
| 4,682,841 | 7/1987 | Afian et al. | 359/15 |
| 4,979,791 | 12/1990 | Bowen et al. | 385/33 |
| 5,061,025 | 10/1991 | Debesis | 359/569 |
| 5,075,800 | 12/1991 | Hasman et al. | 359/569 |
| 5,117,476 | 5/1992 | Yingst et al. | 385/88 |
| 5,202,775 | 4/1993 | Feldman et al. | 359/11 |
| 5,289,298 | 2/1994 | Smith | 359/14 |
| 5,315,427 | 5/1994 | Rauch et al. | 359/569 |
| 5,361,149 | 11/1994 | Hasegawa et al. | 359/16 |
| 5,383,000 | 1/1995 | Michaloski et al. | 355/67 |
| 5,534,386 | 7/1996 | Petersen et al. | 430/320 |
| 5,610,733 | 3/1997 | Feldman et al. | 359/9 |
| 5,630,661 | 5/1997 | Fox | 362/187 |
| 5,631,721 | 5/1997 | Stanton et al. | 355/71 |
| 5,657,138 | 8/1997 | Lewis et al. | 359/15 |
| 5,850,300 | 12/1998 | Kathman et al. | 359/9 |
| 5,861,990 * | 1/1999 | Tedesco | 359/599 |

OTHER PUBLICATIONS

J. Cederquist, et al., "Computer–Generated Holograms for Geometric Transformations", Applied Optics, vol. 23. No. 18 Sep. 1984, pp. 3099–3104.

Sunny Bains, "Holographic Optics: When Less is More", Laser Focus World, pp. 151–156, Apr. 1993.

M.T. Eismann, et al., "Iterative Design of a Holographic Beamformer", Applied Optics, vol. 28, No. 13, pp. 2641–2649, Jul. 1989.

R. Brauer, et al., "Diffusers in Digital Holography", J. Opt. Soc. America, vol. 6, No. 3, pp. 572–578, Mar. 1991.

* cited by examiner

FIG.5A
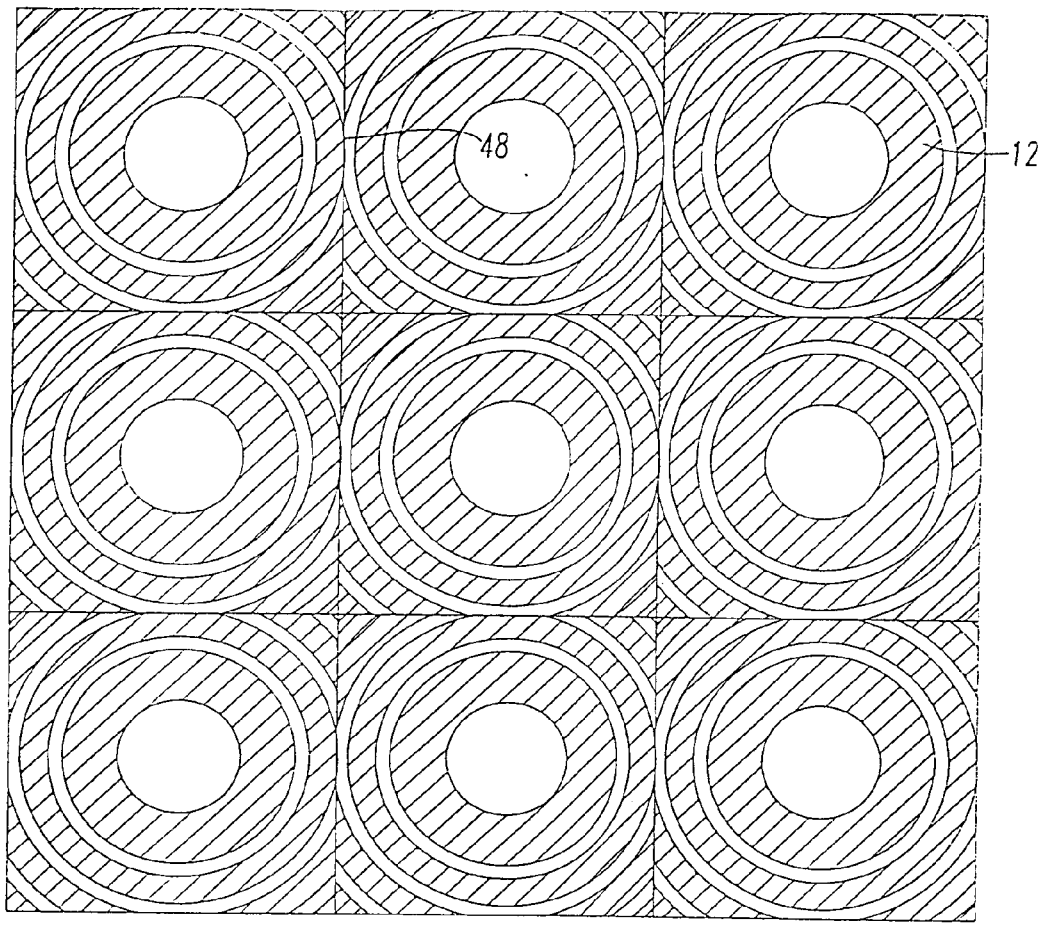
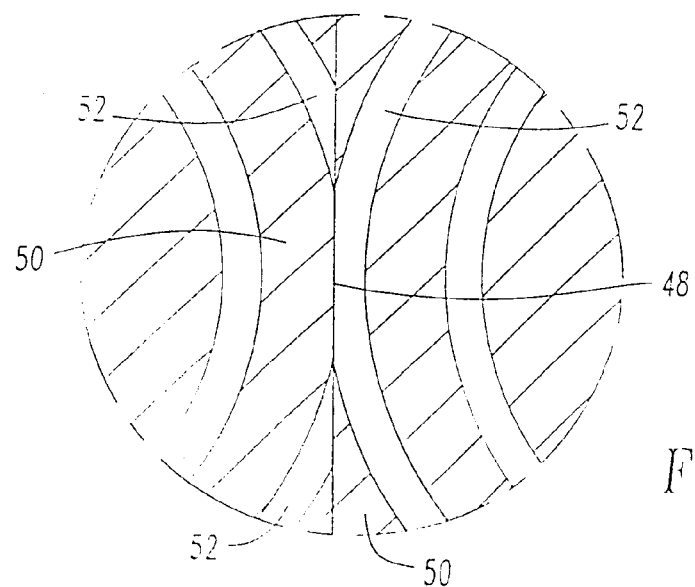
FIG.5B

BEAM HOMOGENIZER

CROSS REFERENCE TO RELATED APPLICATIONS

This is a continuation application of pending application Ser. No. 09/160,322 filed Sep. 25, 1998, now U.S. Pat. No. 6,025,938, which is a continuation of Ser. No. 08/770,524, filed Dec. 20, 1996 now U.S. Pat. No. 5,850,300, which is continuation-in-part application of Ser. No. 08/203,188 filed Feb. 28, 1994 is now U.S. Pat. No. 5,610,733.

FIELD OF THE INVENTION

The invention relates generally to an optical apparatus, and pertains more specifically to a system for producing an output beam having a preselected distribution of power and/or energy while minimizing undesired intensity variations at the output plane caused by sharp breaks between facets.

BACKGROUND OF THE INVENTION

A laser device generally produces a beam of coherent light that has a wavefront of relatively small cross-section. In spite of the small cross-section and the coherency of the beam, the wavefront of a laser typically has a nonuniform power distribution that is stronger in the center than at the outer edges. The power variation may be between five and ten percent Furthermore, to make use of the beam, it is often necessary to expand the cross-sectional area of the beam, thereby spreading the non-uniformity across a larger wavefront.

When conventional lenses are used to expand the beam, the non-uniform power distribution of the wavefront is carried through to the expanded beam. In addition, the non-uniformity of the beam becomes more apparent as the wavefront is now expanded over a greater cross-sectional area. This non-uniformity is often detrimental to the performance of a system utilizing the beam as the system must be designed for some average level of beam power or another approach would be to somehow strip the beam of its lesser power outer portions, possibly through the use of an aperture. Neither of these alternatives enable optimum use of the beam's power and it is very difficult to achieve a uniform power distribution, such as the plus or minus one percent variation that is often desired, by way of conventional lens systems.

Holographic elements have been created to function as conventional bulk optical elements. In these cases, the holographic element, whose orientations and spatial periods are correct for the purpose of diffracting the incident wavefront into a desired output location pattern, shape or image. However, when built to function as a basic lens, these holographic elements would also carry the nonuniform power distribution through to the output pattern, shape or image, thereby also inefficiently using the power of the optical source.

The problem of how to compensate for wavefronts having a nonuniform power distribution is addressed U.S. Pat. No. 4,547,037. In this patent discloses a multi-faceted holographic element which redistributes the light energy of an incident beam onto a second plane disclosed. This is accomplished by constructing each facet as an individual hologram or diffraction grating. Each facet is sized to be inversely proportional to the intensity of the portion of the beam incident thereupon to assuring that substantially the same amount of power passes through each facet. The light transmitted through each facet is diffracted to arrive at different locations on a second plane, relative to their locations in the holographic element. Each of the subholograms or diffraction gratings either expand or contract the portion of the incident beam passing therethrough to illuminate equal, but different, areas on the second plane, thereby producing an output beam at the second plane with a wavefront of nearly constant intensity.

A problem with devices incorporating the teachings of the '037 patent is that if the power distribution of the incident beam upon the surface of the hologram deviates from the design parameters, then the power distribution of the output beam at the second plane will be similarly affected and thus no longer uniform. In optical systems, there are many causes for such deviation in the power distribution of the incident beam could occur. For example, power fluctuations due to the age of the components, or simply the replacement of the source due to failure. In addition, any misalignment within the system due to shock or age will produce an output wavefront having a non-uniform power distribution.

What is needed is an relatively inexpensive way to convert an incident optical beam having a wavefront with a non-uniform spatial energy distribution to an output beam having a substantially uniform spatial energy distribution that is relatively insensitive to fluctuations in positioning of the incident beam and spatial energy distributions within the incident beam.

Further, what is needed is a relatively inexpensive way to convert an incident optical beam having a wavefront with a non-uniform spatial energy distribution to an output beam having a preselected spatial energy distribution using a hologram that does not have regular breaks between facets in order to better minimize the intensity variations on the output plane caused by regular breaks between facets.

Further, what is needed is a relatively inexpensive way to convert an incident optical beam having an arbitrary wavefront to an output beam having preselected attributes, including preselected angular spread, such that the output beam is useful in photolithography. Photolithographic exposure systems are used to image the pattern of a mask onto a wafer for the purposes of exposing resist, or photoresist, on the wafer in a pre-determined pattern. Subsequent processing of the wafer results in the completion of layers that eventually form the desired device, such as an integrated circuit.

When the mask is used in a projection lithography system, such as a laser stepper with a 5:1 or 10:1 reduction ratio, the mask is often referred to as a reticle. The reticle or mask is typically formed by chrome regions on a transparent substrate. The chrome regions of the mask block the incident light, thereby imposing the pattern of the mask as an intensity variation on the light. In a 5× laser stepper, the pattern of the reticle is reduced by a factor of 5 as imaged onto a wafer. Typically, in this application, the beam illuminating the diffractive is relatively uniform and has a rather narrow cone angle of divergence, i.e., limited spatial and angular energy distributions.

While masks and reticles control the intensity of light on the wafer, there is a need for an element that controls the angular distribution of the light on the wafer. By modifying the particular angular distribution of the light illuminating the wafer, one can extend the depth of the field and resolving power of photolithographic exposure systems. This element should ideally be inexpensive and relatively insensitive to fluctuations in positioning of the incident beam and to fluctuations in the spatial energy distributions of the incident beam.

Moreover, what is needed is a relatively inexpensive way to convert a collimated incident optical beam having a wavefront with non-uniform spatial energy distribution to an output beam having a preselected spatial energy distribution, or a preselected beam shape, that is relatively insensitive to fluctuations in positioning of the incident beam and spatial energy distributions within the incident beam. Additionally, what is needed is a relatively inexpensive way to convert an incident optical beam having a wavefront with non-uniform spatial energy distribution to an output beam having preselected attributes, such as spatial energy distribution, or a preselected beam shape, or a preselected angular energy distribution, that is relatively insensitive to fluctuations in positioning of the incident beam and spatial energy distributions within the incident beam.

SUMMARY OF THE INVENTION

The invention is a beam homogenizer for converting an incident beam having a non-uniform spatial energy distribution into an output beam of preselected spatial energy distribution. The incident beam is incident upon the beam homogenizer, formed as an array of facets where each facet is constructed to transmit any portion of the incident beam incident thereupon to an output plane spaced from the beam homogenizer so that the light transmitted through each of the facets overlap at the output plane to form the output beam which now has a substantially uniform spatial energy distribution.

Additionally, the invention is a beam homogenizer that minimizes undesired intensity variations at the output plane caused by sharp breaks between facets. At least part of a hologram comprising irregularly patterned diffractive fringes is illuminated by an input beam. That part transmits a portion of that beam onto an output plane, whereby the energy of the input beam is spatially redistributed at the output plane into a homogenized output beam having a preselected spatial energy distribution at the output plane such that the illuminated portion of the output plane is a predetermined shape and a predetermined magnitude.

Moreover, the invention is a beam homogenizer for converting a input beam having a non-uniform spatial energy distribution into an output beam having a preselected spatial energy distribution at an output plane while minimizing the intensity variation caused by breaks between facets. An input beam illuminates at least some of the facet areas of a hologram. The facet areas have irregularly patterned diffractive fringes. The facet areas transmit a beam such that at an output plane, the majority of the portion of the input beam transmitted through each of said illuminated facet areas overlaps the portion of the input beam transmitted through at least one other illuminated facet whereby the energy of the input beam is spatially redistributed at the output plane into a homogenized output beam having a preselected spatial energy distribution at the output plane. The array of facet areas is a computer-generated hologram, relatively insensitive to fluctuations in positioning of the input beam for incidence thereupon and to spatial energy distributions within the input beam. The homogenizer transmits the transmitted portion of the input beam at a preselected angular spread and illuminates a target area corresponding to a preselected spatial energy distribution desired at the output plane.

Additionally, the invention is a beam homogenizer system for converting an input beam having a non-uniform spatial energy distribution into an output beam having a preselected spatial energy distribution at an output plane while minimizing the intensity variation caused by breaks between sub-holograms. An input beam illuminates at least some of an array of computer generated subholograms whose size is determined independently of the intensity of the portion of the input beam incident thereupon, and being relatively insensitive to fluctuations in positioning of the input beam for incidence thereupon. Each sub-hologram diffracts a majority of the portion of the input beam incident thereupon so that at a target located at the second plane, the portion of the input beam diffracted by each of the illuminated sub-holograms overlaps the portion diffracted by at least one other illuminated computer generated sub-hologram to form an output beam. The intensity of the output beam is substantially equalized over a entire target. The output beam has a preselected angular spread and the target corresponds to a preselected spatial energy distribution desired at the output plane.

Additionally, the invention is a method of homogenizing an input beam having an arbitrary spatial energy distribution at a first plane into an output beam with a preselected spatial energy distribution at a second plane while minimizing the intensity variation caused by breaks between sub-holograms. Steps taken are providing a holographic optical element comprising an array of computer generated sub-holograms with irregularly patterned diffractive fringes, fixedly positioning the element at the first plane so that the input beam illuminates at least some of the sub-holograms, each illuminated sub-hologram expansively diffracting the portion of the input beam incident thereupon over an entire target at the second plane to superimpose the diffracted portions of all of the illuminated sub-holograms to form an output beam at the second plane, wherein the step of providing the holographic element comprises generating an array of sub-holograms that is relatively insensitive to fluctuations in positioning of an input beam for incidence on said array and to spatial energy distributions within the incident beam. In the invention, each illuminated sub-hologram expansively diffracts the portion of the input beam incident thereupon at a preselected angular spread and produces a preselected spatial energy distribution desired at the output plane.

Additionally, the invention comprises a beam homogenizer system for converting an incident beam having an arbitrary spatial energy distribution into an output beam having preselected spatial energy distribution at an output plane spaced from the homogenizer while minimizing the intensity variation caused by breaks between sub-holograms. An array of sub-holograms designed with an iterative encoding method such that each sub-hologram has irregularly shaped diffractive fringes, and such that portions of incident beam diffracted by several of said sub-holograms overlap at the output plane, whereby the output beam has a preselected spatial energy distribution that is relatively insensitive to fluctuations in positioning of an input beam for incidence on the homogenizer and to spatial energy distributions within the incident beam. Each sub-hologram transmits a beam with a preselected angular spread. The output beam has a preselected spatial energy distribution desired at the output plane.

Additionally, the invention is a beam homogenizer system for converting an incident beam having an arbitrary spatial energy distribution and limited angular energy distribution into an output beam having a preselected angular energy distribution while minimizing the intensity variation caused by breaks between sub-holograms. An array of sub-holograms, each of said sub-holograms having irregularly shaped diffractive fringes, and each of said sub-holograms containing pixels that exhibit phase skipping and the light diffracted by at least two of the sub-holograms overlap in the output plane to form an output beam. The output beam has a preselected angular spatial energy distribution that is relatively insensitive to fluctuations in positioning of an input beam for incidence on said homogenizer and spatial energy distributions within the incident beam. The output beam has a preselected spatial energy distribution and/or a preselected angular energy distribution.

Additionally, the invention is a beam homogenizer for converting an input beam of non-uniform spatial distribution into an output beam of a more-uniform distribution. A computer-generated hologram in the invention has a phase-transmittance pattern. The Fourier Transform of the phase-transmittance pattern is uniform over a preselected angular region. The pattern is made up of one or more binary phase elements.

Additionally, the invention is a system for modifying the angular spread of an incoherent or partially coherent beam of light. An incident beam propagating with a cone angle is diffracted by a diffractive diffusing element into a range of preselected angles. These angles are determined by or dictated by the cone angle of the incident beam and the Fourier Transform of the diffusing element.

Additionally, the invention is a photolithographic-optical system. An input beam illuminates a diffractive diffusing element. The diffractive diffusing element illuminates a mask by the element's transmission of an output beam at a preselected angular distribution.

It is an object of this invention to convert an incident optical beam having a non-uniform spatial energy distribution to an output beam having uniform spatial energy distribution at an output plane.

It is a further object of this invention to convert an incident beam having a non-uniform spatial energy distribution into an output beam having a preselected spatial energy distribution at an output plane spaced from the homogenizer while minimizing the intensity variation caused by breaks between facets.

It is a further object of this invention to convert an incident beam having a non-uniform spatial energy distribution into an output beam having a preselected spatial energy distribution of a preselected shape at an output plane spaced from the homogenizer.

It is a feature of this invention that the optical beam having a non-uniform spatial energy distribution incident upon a homogenizer having an array of facets and the portion of the incident beam transmitted through each facet is imaged over an entire target on overlap at an output plane, thereby homogenizing the incident optical beam to produce an output beam of substantially uniform power distribution at the output plane. It is another feature of this invention that the homogenizer is a hologram and each of the facets are subholograms. It is yet another feature of this invention that the subholograms are designed to minimize interference effects at the output plane between the light transmitted through the facets.

It is a feature of this invention that the incident beam having a non-uniform spatial energy distribution is converted into an output beam having a preselected spatial energy distribution at an output plane spaced from the homogenizer while minimizing the intensity variation caused by breaks between facets. It is a further feature of this invention that an incident beam having a non-uniform spatial energy distribution is converted into an output beam having a preselected spatial energy distribution of a preselected shape at an output plane spaced from the homogenizer.

It is an advantage of this invention that the homogenizer may be developed by computer generation techniques and may be fabricated relatively inexpensively. It is another advantage of this invention that the homogenization is relatively insensitive to fluctuations in the power density of the incident beam. It is a further advantage of this invention that the intensity of the output beam is substantially insensitive to the location the incident beam falls on the homogenizer.

It is a further advantage of this invention that it can convert an incident beam having a non-uniform spatial energy distribution into an output beam having a preselected spatial energy distribution at an output plane spaced from the homogenizer while minimizing the intensity variation caused by breaks between facets. It is a still further advantage of this invention that the invention can convert an incident beam having a non-uniform spatial energy distribution into an output beam having a preselected spatial energy distribution of an arbitrary preselected shape at an output plane spaced from the homogenizer.

It is a still further advantage of this invention that it can convert an incident beam having arbitrary spatial energy distribution and limited angular energy distribution into an output beam of preselected angular energy distribution or of preselected shape at an output plane spaced from the homogenizer.

BRIEF DESCRIPTION OF THE DRAWINGS

The present invention will now be described by way of example with reference to the accompanying drawings in which:

FIG. 5A shows a hologram having multiple facets and showing the sharp breaks between facets.

FIG. 5B shows a close-up view of the hologram shown in FIG. 5A such that the sharp breaks between facets are seen in greater detail.

DESCRIPTION OF THE PREFERRED EMBODIMENT

Figure 1:
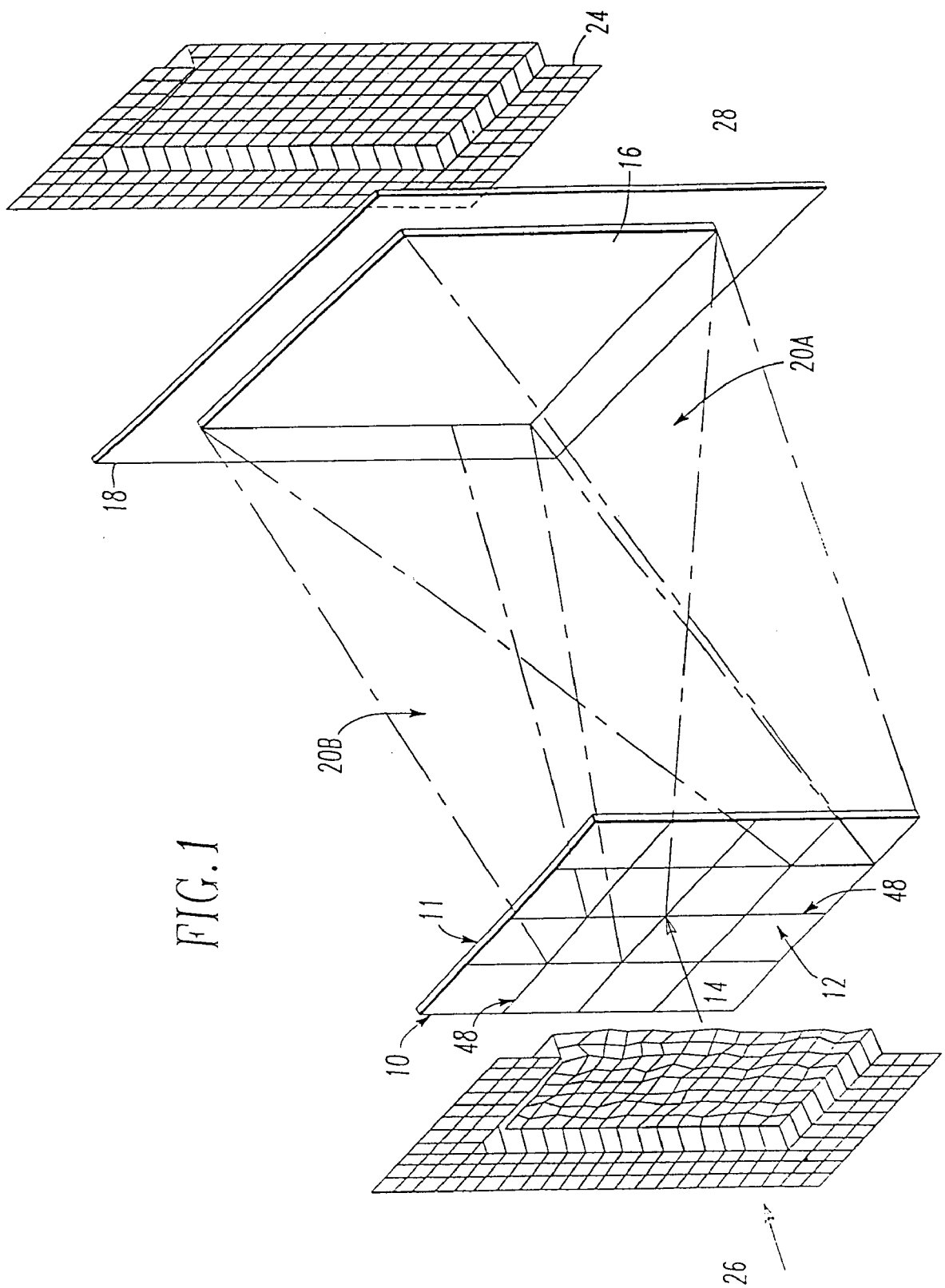
FIG. 1 shows the spatial energy distribution of a beam incident upon a homogenizer of the present invention and how the portions of the incident beam that are transmitted through the homogenizer are constituted at an output plane to produce an output beam having a substantially uniform power distribution.

The present invention is shown in FIG. 1. An optical beam is incident on a homogenizer 10 having an array 11 of facets 12. Each of these facets 12 are constructed to direct any portion of an incident optical beam 14 that is incident thereupon uniformly over an entire target 16 at an output plane of 18. As the portion of the incident beam transmitted through each of the facets 12 (shown illustratively as 20a and 20b) overlap at the target 16, the incident optical beam is mixed, thereby homogenizing the discrete portions of the incident beam 14 that are the transmitted through each facet 12. This homogenization assures that at the target 16 there is a uniform mix of the incident beam 14, such that at the output plane 18 the output beam 22 has a uniform power distribution 24. The homogenization process averages the power of the incident beam 14 with some losses due to inefficiencies.

Figure 2:
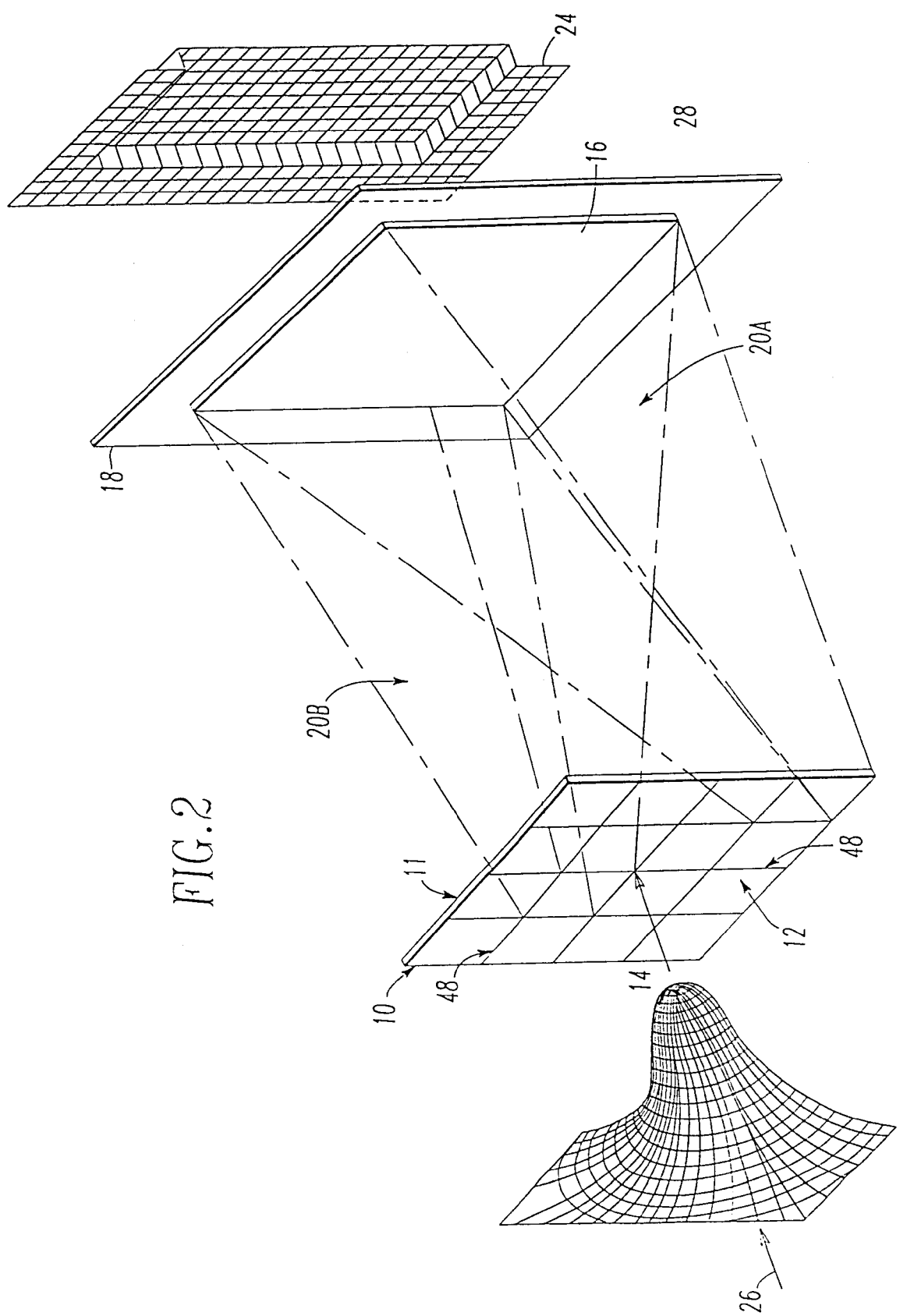
FIG. 2 shows the spatial energy distribution of an incident beam that is typical of a excimer laser incident on a homogenizer and the resulting output beam.
Figure 3:
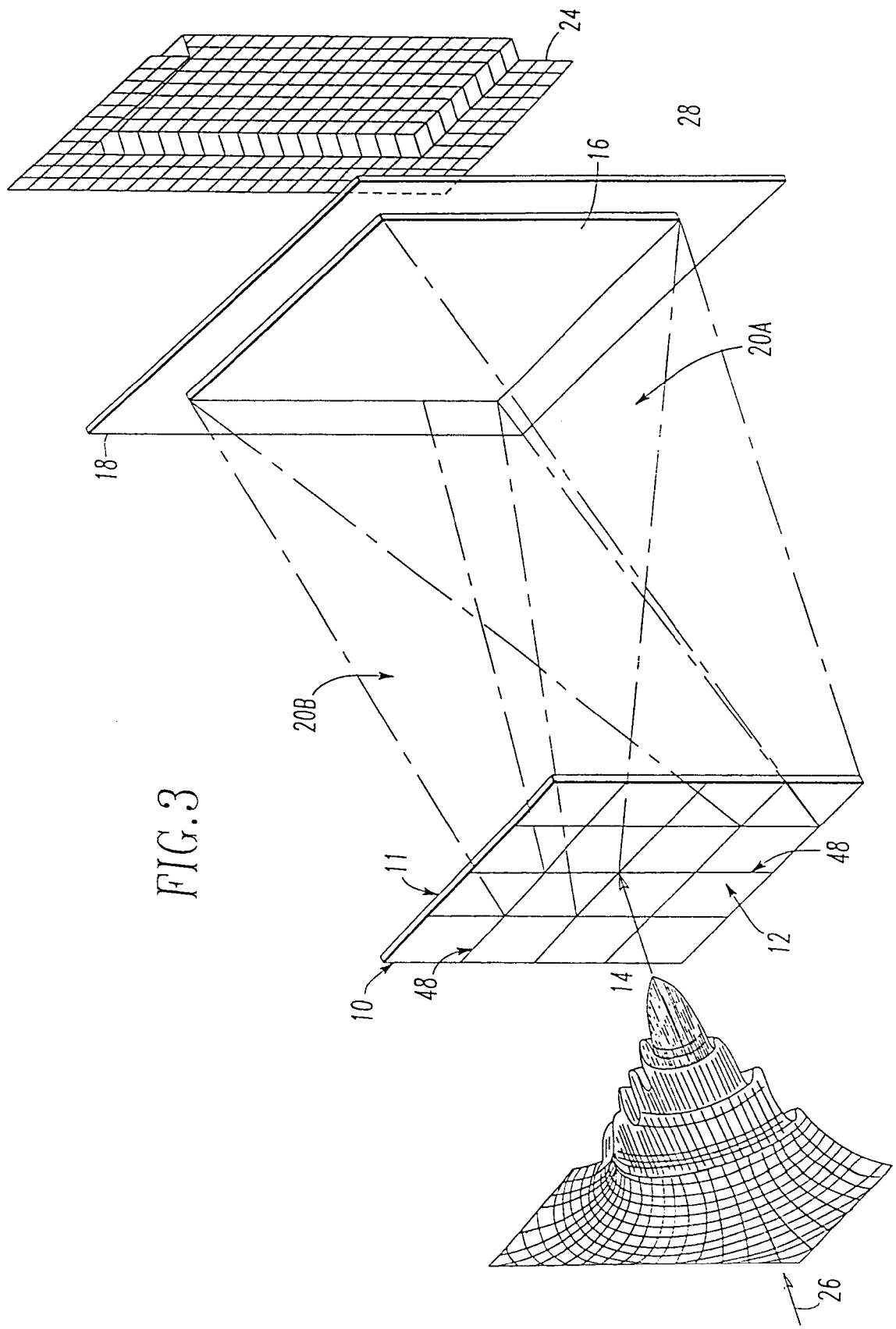
FIG. 3 shows yet another spatial energy distribution of an incident beam that is typical of a Nd:YAG laser incident on a homogenizer and the resultant output beam.

The incident optical beam 14 emanates from an optical source (not shown), such as a laser, and is preferably in a collimated state, the spatial energy distribution of the incident beam may take on various forms, some of which are illustrated in FIGS. 1–3. The incident optical beam 14 may be transferred to the homogenizer 10 from the optical source and collimated by way of conventional bulk optical elements, such as lenses and mirrors, or through the use of holographic elements that produce the same results as conventional optical elements. Typically, the incident beam 14 has a power distribution 26 that may have a significant intensity variation across its cross-section. In some sources the intensity distribution 26 variation could be between five percent and ten percent. In addition, as the optical source ages or the power supply driving the optical source fluctuates, the power distribution 26 of the incident beam 14 may also change. The beam homogenizer 10 is constructed to blend the incident optical beam 14 so that at the target 16 of the output plane 18 the output beam 22 will have an essentially uniform power distribution 24, independent of any variation in the power distribution 26 of the incident beam 14 and regardless of slight variation in where the incident beam 14 falls on the array 11. The power distribution 24 at the target 16 will be essentially an average of the power uniformity over each facet 12 rather than the power uniformity 26 of the incident signal 14.

The beam homogenizer 10 in this embodiment is a holographic element and the facets 12 are sub-holograms, shown in the FIGURE as a M×N linear array of equal sized sub-holograms. It is also envisioned that the sub-holograms may be of different sizes. These sub-holograms 12 are constructed to diffract any portion of the incident optical beam 14 that is incident thereupon over the entire target 16 at the output plane 18. Each of these sub-holograms 12 is a distinct diffractive grating that will direct the portion of the incident beam 14 over the entire target 16. Due to the number of fringes or pixels, which would approach eighty lines per millimeter (80 lines/mm) for the sub-holograms 12 in the particular implementation described below, these fringes have been omitted from the drawing for the sake of clarity. In addition, the homogenizer 10 is shown as a four-by-four array 11 for clarity of illustration and ease of description, while in reality, a described below, there may be substantially more sub-holograms 12, or facets, making up the homogenizer 10.

One way of fabricating holograms is by creating an interference pattern among coherent light beams on a photographic plate and then developing the plate. Interference based holograms contain internal features which produce the interference fringes, making mass production at this time difficult.

In order to overcome the production problems associated with interference based holograms, Computer Generated Holograms (CGH) have been developed. CGH's may be developed by calculating the desired holographic pattern and then, based upon the given construction conditions, mathematically working backwards from that pattern, or reconstructed wavefront, to the particular hologram required. Several iterative CGH encoding methods have been developed to take advantage of the increased performance of computers to develop CGHs with significantly higher performance than holograms developed using other mathematical techniques.

CGHs are usually surface-relief in nature and CGHs are formed using photolithographic, etching, electron-beam writing or other techniques. The electron-beam technology provides resolution close to that of optical film, but contains amplitude and phase quantization levels that are much coarser. Photolithic procedures can provide multilevel holograms; however, alignment error between the layers increases with the number of layers.

Note that the major difference between the present invention and that of U.S. Pat. No. 4,547,037 is that in the latter the light illuminating each facet is directed to a different location in the output plane. On the other hand, in the present invention light from many facets will overlap in the output plane. While the advantages of this feature were explained earlier, the disadvantage of this feature is that in locations in the output plane where light from several facets overlap, coherence effects can cause interference patterns to arise that could cause large fluctuations in the laser intensity profile, if the holograms are not specifically designed to avoid this problem. For example, if the subhologram were designed independently, and the size of each subhologram was made smaller than the spatial coherence width of the laser source, then the coherence effects could cause large bright and dark fringe patterns in locations where the light from several facets overlap.

This problem can be reduced by designing the subholograms with an iterative encoding method such as Iterative Discrete On-axis (IDO) encoding. This method is more fully described in the publication entitled *Iterative Encoding of High-Efficiency Holograms for Generation of Spot Arrays,* Optics Letters, Vol. 14, pp. 479–81, 1989 by co-inventor Feldman et al. the disclosure of which is hereby incorporated by reference. Briefly, the hologram is divided into a two-dimensional array of rectangular cells and transmittance values for each cell is chosen and then optimized until an acceptable image is obtained. During the optimization process, the image, including interference effects between different facets, are monitored. The transmittance values for each cell is chosen to not only spread the light illuminating each facet over a large portion of (or the entire) output plane, but also to minimize the interference effects among the facets. Since on-axis encoding does not require a carrier wavefront for the hologram to function, these holograms can produce CGH's with much higher diffraction efficiencies than off-axis methods which do require a carrier wavefront. This is because holograms have a practical upper limit to the available Space-Bandwidth Product (SBP), or information contained in the CGH, that can be used to encode the desired image. When no information is required for a carrier wavefront, more information may be encoded relative to the desired image. It may also be desirable to use the encoding method described in U.S. Pat. No. 5,202,775 titled Radially Symmetric Hologram and Method of Fabricating the Same which is also incorporated herein by reference. One usual characteristic of iterative encoding methods such as IDO and RSIDO is that of "phase skipping." Phase skipping, described also in U.S. Pat. No. 5,202,775 occurs when two adjacent CGH pixels have phase levels that differ by more than one phase level but less than by N−1 phase levels. Note that phase skipping does not occur when binary or multi-level gratings are employed such as those described in U.S. Pat. No. 4,547,037.

In applying the IDO method to the design of each sub-hologram 12, it is important to keep the diffraction angles small so that a high efficiency CGH, with physically realizable features, can be developed based on the short wavelength of the incident optical beam 14. For this particular example, the incident optical beam 14 is assumed to have an elliptical form of 2.5 cm by 1 cm (centimeter) with a wavelength of 308 nm±1 nm (nanometer). The target 16, or output beam 22, could take on a number of shapes including circular or square and in particular in this described example the diameter at the output plane 18 is selected to be 1.5 cm. Under these conditions the maximum deflection angle of the beam homogenizer 10 will be 2.9° if the spacing between homogenizer 10 and the target 16 on the output plane 18 is 20 cm.

With the maximum CGH deflection angle being 2.9°, a maximum spatial frequency of 160 lp/mm (line-pairs/millimeter) is required. In order to have an economical use of the optical power of the source, in this case a laser (not shown), the CGHs that make up the homogenizer must have high diffraction efficiency. A diffraction efficiency of approximately 80% to 90% would be obtainable if the CGH spatial frequency is 800 lp/mm, or approximately four times the maximum spatial frequency required. The CGH spatial frequency of 800 lp/mm corresponds to a CGH minimum feature size of 0.6 $\mu$m (micrometer).

A further requirement to enable the CGH to have the high efficiency needed for economical use of the power of the incident beam is that the SBP (Space Bandwidth Product) of each sub-hologram be greater than or equal to 128×128. SBP is the number of pixels in the subhologram. It is also a measure of degrees of freedom. In general, a large number of degrees of freedom are needed to implement arbitrary optical functions with high efficiencies. This places a lower boundary on the dimensions of each of the subholograms of 77 $\mu$m×77 $\mu$m. With the dimensions of each subhologram set to 100 $\mu$m×100 $\mu$mA a 100×100 facet array is of sufficient size to be used with the beam of the present example. These particular parameters yield a SBP of 167×167 well above the projected minimum SBP of 128×128 required for a diffraction efficiency between 80–90%. The calculated final diffraction efficiency for this device is projected to be between 85% and 95%.

The transmittance 20$a$,20$b$ of each sub-hologram 12 will cover the entire target 16 at the output plane 18 and form the homogenized output beam 22. It is anticipated that the output beam 22 diameter will be 1.5 cm×1.5 cm. In this case the output beam 22 is of a smaller diameter than the input beam 14. It would also be possible for the output beam 22 to be expanded by the homogenizer 10 such that the target 16 will have a larger cross-section than the input beam 14 or any arbitrary profile desired.

The output plane 18 represents an area in space rather than any particular element. It would be possible to place a bulk optical element, an optical fiber, another hologram, an active device or any other apparatus that would make use of the output beam, such as a blocking mask or an object to be illuminated. One such application would be to incorporate an optical element at the output plane 18 that would enable the output beam to be used in laser cutting machines. In the absence of the homogenizer 10, a beam used in laser cutting applications has the intensity distribution of the incident beam 24 or a significant amount of the power of the incident beam will be lost by passing the beam through an aperture. As shown in FIG. 1, the wavefront of the incident beam has a higher power center section, or "hotspot", that will cut through material faster than the lesser power outer fringe section. This makes for less accurately cut edges since the edge would take on a shape that approximates the reciprocal of the wavefront of the incident beam power distribution. The power distribution of the output wavefront at the target illustrates the crisp power difference between off-target and on-target intensities of the homogenized beam. With the homogenized power distribution of the homogenized beam, cutting occurs more uniformly across the output beam to produce a more accurate edge.

Figure 4:
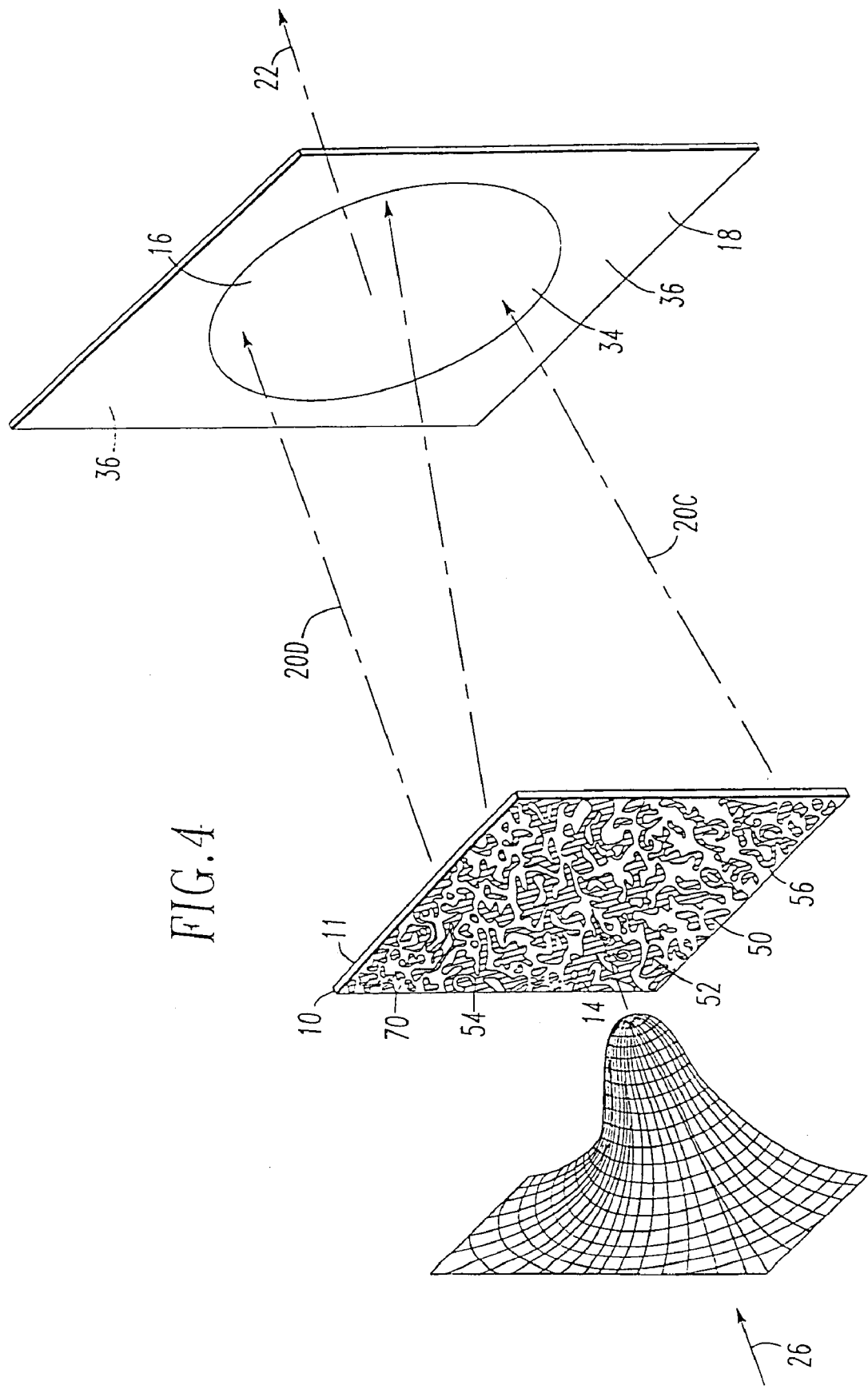
FIG. 4 shows the spatial energy distribution of a input beam incident upon a homogenizer of the present invention, how the homogenizer has irregularly patterned plateaus and vias, and how the portions of the incident beam that are transmitted through the homogenizer are constituted at an output plane to produce and output beam having a substantially stable power distribution and having a preselected power distribution shape of a circle.

Another embodiment of the present invention is shown in FIG. 4. This embodiment, like the embodiments described previously, homogenizes the spatial power distribution at the output plane. This embodiment, though, eliminates the sharp edges or breaks between facets of the prior art and the embodiments described above, thusly eliminating intensity variation at the output plane caused by such sharp edges or breaks. This embodiment also transmits the beam incident upon the homogenizer at a preselected angular spread or angular divergence. Also, the embodiment shown in FIG. 4 illuminates preselected, shaped target areas at the output plane. Another way to describe or designate the preselected, shaped target area is that it is a preselected spatial power distribution at the output plane. Still another way to describe it is that it is a shaped pattern beam at the output plane. All of the design and manufacturing methods and features described for use in previous embodiments are equally applicable to the embodiment shown in FIG. 4.

Sharp edges or breaks 48 between facets 12, as seen in FIG. 1, FIG. 2, and FIG. 3, are structure on the homogenizer. FIG. 5A shows a hologram 46 in which sharp edges or breaks 48 between facets 12 can be clearly seen. FIG. 5B shows a close-up view of the sharp edges or breaks 48 between the facets 12 of the hologram 46 shown in FIG. 5A. Note additionally that interaction between diffractive fringes, made up of plateaus 50 (shown as white areas) and vias or valleys 52 (shown as black areas) in the preferred embodiment, at the edges of the facets create some undesired structure at the output plane.

Such structure 48 on the homogenizer causes some undesired diffraction of the input beam incident upon the homogenizer. Regularly patterned, or regularly repeated, such structure diffracts the incident beam 14 such that undesirable distinct, repeated intensity variation in spatial power distribution appears at the output beam at the output plane.

The embodiment shown in FIG. 4 removes such sharp edges or breaks and thusly minimizes the intensity variations caused by such edges or breaks. The embodiment shown in FIG. 4 replaces the regularly patterned facet array 11 of previous embodiments with a optical instrument 54, such as a hologram, having irregularly patterned diffractive fringes 70 or diffractive gratings. The diffractive fringes 70 of the preferred embodiment are made up of plateaus 50 (shown as white areas) and vias or valleys 52 (shown as black areas), and the diffractive fringes will be referred to herein by reference to plateaus and vias. One of ordinary skill in the art of this invention will recognize the construction of holograms of plateaus and vias that approximate lenses. U.S. Pat. No. 4,895,790 discloses the construction of optical elements having plateaus and vias, and the disclosure of that patent is incorporated herein. Also, U.S. Pat. No. 5,202,775 discloses a method of fabricating holograms and the disclosure in that patent is incorporated herein.

A homogenizer comprising a hologram having irregularly patterned plateaus 50 and vias 52 no longer has regular sharp edges or breaks to cause undesired regular and repeated intensity variation on the output plane. This is shown in FIG. 4.

Facet area, for purposes of the invention shown in FIG. 4, refers to an area of arbitrarily designated size on the hologram 54. It is used as a convenient way to refer to an area of irregularly shaped or patterned diffractive fringes (irregularly shaped or patterned plateaus and vias in the preferred embodiment) on the hologram. A hologram has at least two facet areas. In the preferred embodiment, no two facet areas 56 contain a pattern of plateaus 50 and vias 52 that are alike. Another convenient way to refer to an area of irregularly shaped plateaus and vias on the hologram is to refer to the area as a facet. The pattern within one facet is nominally correlated to itself and nominally uncorrelated to the pattern in all other facets. Therefore, each facet within the hologram directs light to the entire target area of the output plane.

Figure 7:
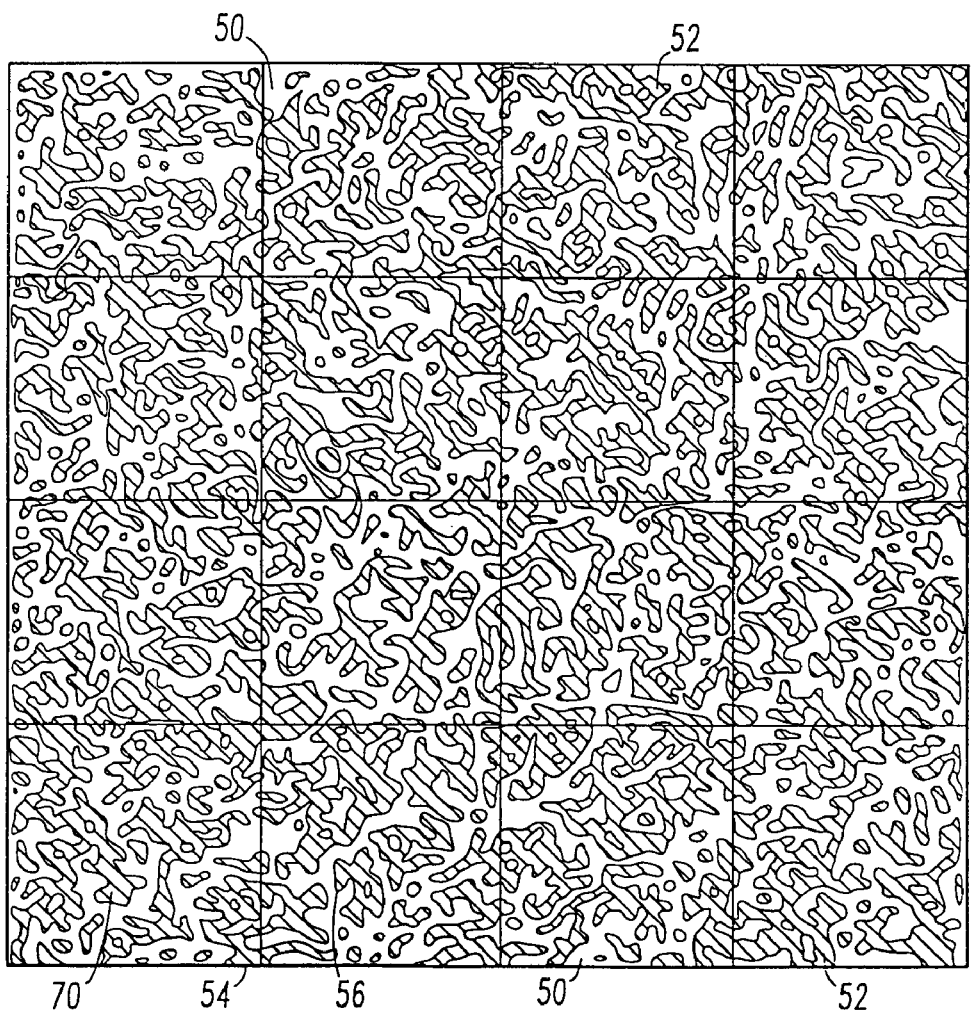
FIG. 7 shows a magnified view of the hologram shown in FIG. 4, showing the irregularly patterned plateaus and vias, and showing the 4×4 array of facet areas of arbitrarily shown size, and showing that the facets are not repeated patterns and exhibit no discontinuities at facet boundaries.

An enlarged, frontal view of the hologram 54 of FIG. 4 is shown in FIG. 7. The hologram 54 of FIG. 7 (and the hologram 54 of FIG. 4) have been arbitrarily designated to have an array of facet areas, or facets, 56 of 4×4 as shown by dotted lines in FIG. 7. These dotted lines are not structure on the hologram, but are used to designate a facet area or a facet of this embodiment, which is a convenient way to refer to an area of the hologram 54 of this embodiment. Each facet area 56 has irregularly patterned plateaus 50 and vias 52. No sharp edges or breaks appear between facet areas 56. The dotted lines are shown designating only one of the sixteen facet areas 56 in FIG. 4 because the dotted lines designating the other fifteen would be hard to see and would confuse if shown in FIG. 4.

Referring to FIG. 4, when the incident optical beam, preferably a collimated beam, illuminates the facet areas, or facets, 56 of the hologram 54, the irregularly patterned plateaus 50 and vias 52 provide no regular, undesired structure to transmit regular, undesired intensity variation (not shown) in the output plane 18. An additional advantage of the present embodiment is that departing from designing each individual facet 56 to designing facet areas or entire holograms provides greater freedom of design that allows the designer to reduce undesired intensity variation in the output plane by making adjustments to the plateaus 50 and vias 52, whereas the sharp breaks or edges of the discrete facet embodiment provided much less design freedom in relation to those sharp breaks or edges. An additional advantage of the present embodiment is that departing from designing each individual facet 56 to designing facet areas or entire holograms provides greater freedom of design that allows greater freedom to create output beams of arbitrary shapes, such as rings and cross-hairs.

Figure 6:
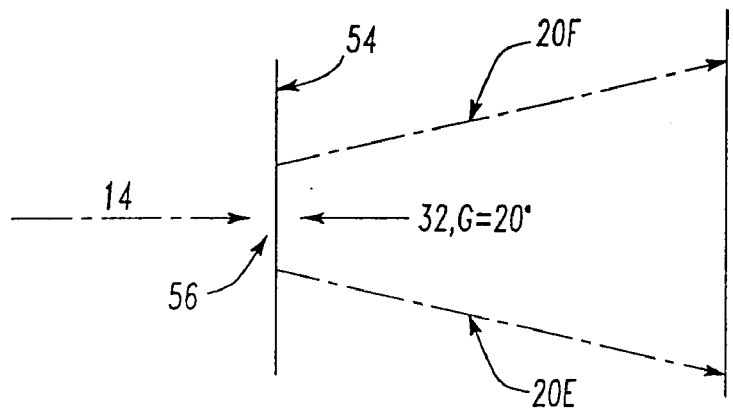
FIG. 6 shows the transmission of a beam with a preselected angular spread of 20 degrees from a facet area to the output plane.

In the embodiment shown in FIG. 4, a collimated input beam 14 illuminates a facet area 56, and the facet area 56 transmits transmittal beams 20c, 20d having a preselected angular spread 32. Those of ordinary skill in the art of this invention are familiar with angular spread. Angular spread, or angular divergence, is the increase in nominal beam size over a finite propagation distance expressed as an angle in radians or degrees. In any given facet area 56, the plateaus 50 and vias 52 diffract the input beam 14 such that the transmitted portions 20c, 20d of the input beam 14 have a preselected angular spread. The angular spread provided by a facet area 56 is selected by the designer of the hologram 54 such that a desired output beam is transmitted to the output plane. Preferably, the designer can preselect an angular spread of from plus/minus zero to plus/minus ninety degrees. In FIG. 6, a facet area 56 (shown in side view) illuminated by a portion of the input beam 14 is shown providing an angular spread 32 of plus/minus twenty degrees for beams 20e, 20f transmitted to the output plane 18.

The choice of angular spread depends upon the application for which the beam homogenizer is used and the desired output beam. The angular spread is selected by the designer as needed for the application at hand. For example, an illumination system for machine vision may require uniform illumination across a 10 degree×15 degree rectangular area. The designer would chose angular spread for the beam homogenizer to obtain such a desired illumination.

With a facet area 56 that transmits a beam with a predesigned angular spread, the designer can control the angle over which the transmitted light 20c, 20d, 20e, 20f is spread. Preferably, the facet areas 56 of the hologram 54 provide angular spread such that the target area 16 illuminated 34 on the output plane 18 is larger than the illuminated facet areas 56.

In the embodiment shown in FIG. 4, the hologram 54 is designed such that a preselected target area 16 of the output plane 18 is illuminated. The embodiment shown in FIG. 4 homogenizes spatial power over that preselected target area. That is, the embodiment provides a constant, preselected power distribution at the output plane even if the power distribution of the incident beam upon the surface of the hologram deviates from design parameters.

The designer can choose any particular shape for the target area 16. The designer designs the plateaus 50 and vias 52 such that a target pattern 16 of a desired shape may be projected upon the output plane 18 from the hologram 54. The spatial frequency content of the hologram is designed to produce a desired pattern. That is, the size and orientation of the plateaus 50 and vias 52 are designed to produce a desired pattern. Preferably, the design takes place using a computer.

In the embodiment, the facet areas 56 transmit portions 20c, 20d of the input beam 14 at predetermined, designed angular spreads. By transmitting light at various, predetermined angular spreads, the facet areas 56 of the hologram 54 projects spatial power in predetermined target patterns 16 onto the output plane 18. Essentially, a target pattern is made up of illuminated areas 34 of the output plane 18 adjacent to non-illuminated areas 36 of the output plane 18. The hologram 54 is designed such that the spatial energy is transmitted to predetermined target areas 34 of the output plane and relatively no spatial energy is transmitted to other predetermined areas 36 of the output plane 18, thus projecting a predetermined target pattern 16 onto the output plane 18.

Figure 8:
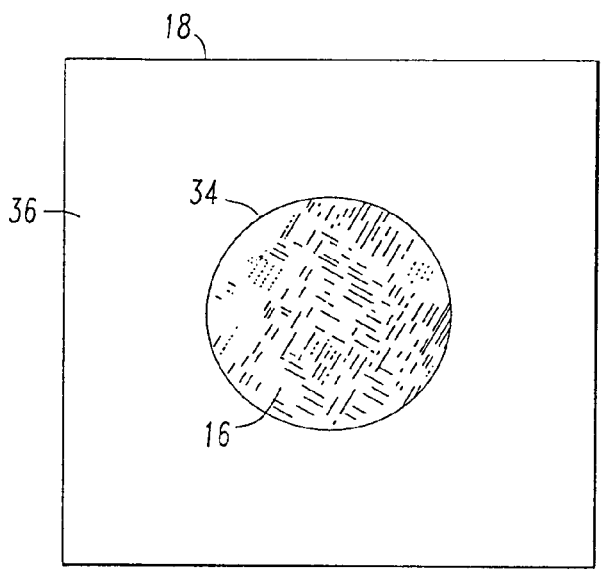
FIG. 8 shows a circular target pattern, that is, a preselected power distribution pattern in which the spatial power is distributed at the output plane in a circle with relatively no distribution around that circle.

The target pattern shown in FIG. 4 is a circular pattern. This pattern is shown in a front view in FIG. 8. In FIG. 8, a circular target pattern 16, that is, a preselected power distribution pattern in which the spatial power is distributed at the output plane 18 in a circle with relatively no distribution around that circle, is shown. That is, FIG. 8 shows a preselected power distribution pattern in which spatial power is distributed at the output plane 18 such that an illuminated circular area 34 is surrounded by a relatively non-illuminated area 36 at the output plane 18. The pattern shown in FIG. 8 was produced by the hologram shown in FIG. 7.

Figure 9:
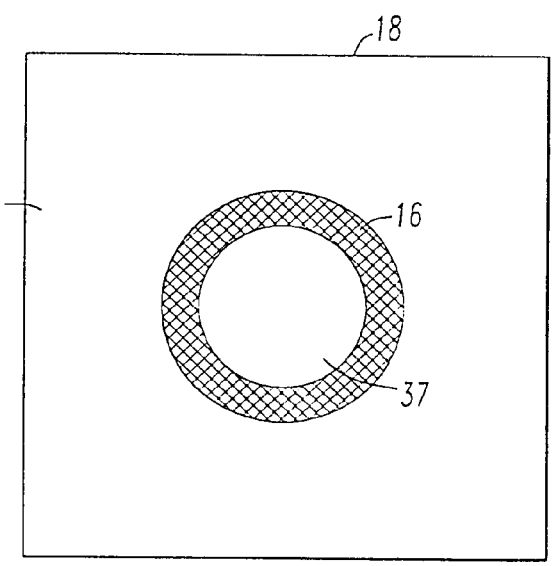
FIG. 9 shows a doughnut-shaped target pattern at the output plane, that is, a preselected power distribution pattern in which the spatial power is distributed at the output plane such that a relatively non-illuminated circular area is surrounded by a ring of illuminated area, which is in turn adjacent to a relatively non-illuminated area.

Other patterns, such as the one shown in FIG. 9, can be selected by the designer of the homogenizer 10 for projection. FIG. 9 shows a doughnut-shaped target pattern 16 at the output plane 18. That is, FIG. 9 shows a preselected power distribution pattern in which the spatial power is distributed at the output plane 18 such that a relatively non-illuminated circular area 36 is surrounded by a ring of illuminated area 34, which is in turn adjacent to a relatively non-illuminated area 36. Non-circular patterns, such as the shape of a flower or rectangle, may also be chosen.

The homogenizer 10 projects patterns having uniform spatial power on illuminated areas 34 of the output plane 18. The patterns 16 shown in FIG. 8 and FIG. 9 have relatively uniform spatial power over their illuminated areas 34.

The embodiment shown in FIG. 4 is highly useful for photolithography. Photolithography is essentially the process of exposing patterns in a photoreactive media. This process is used to fabricate integrated circuits. The patterns to create these sophisticated devices must be imaged with high fidelity and maximum resolution in the photolithography process.

Photolithographic exposure systems are used to image the pattern of a mask onto a wafer for the purposes of exposing resist on the wafer in a predetermined pattern. Subsequent processing of the wafer results in the completion of layers that eventually form the desired device, such as an integrated circuit.

When the mask is used in a projection lithography system, such as a laser stepper with a 5:1 or 10:1 reduction ratio, the mask is often referred to as a reticle. The reticle or mask is typically formed by chrome regions on a transparent substrate. The chrome regions of the mask block the incident light, thereby imposing the pattern of the mask as an intensity variation on the light. In a 5× laser stepper, the pattern of the reticle is reduced by a factor of 5 as imaged onto a wafer. Typically, in this application, the beam illuminating the diffractive is relatively uniform and has a rather narrow cone angle of divergence, i.e., limited spatial and angular energy distributions.

The present invention allows for the control of the angular distribution of the light on the wafer. By modifying the particular angular distribution of the light illuminating the wafer, one can extend the depth of the field and resolving power of photolithographic exposure systems. Additionally, the present invention is advantageous in photolithography because it is relatively insensitive to fluctuations in positioning of the incident beam and to fluctuations in the spatial energy distributions of the incident beam.

Figure 10:
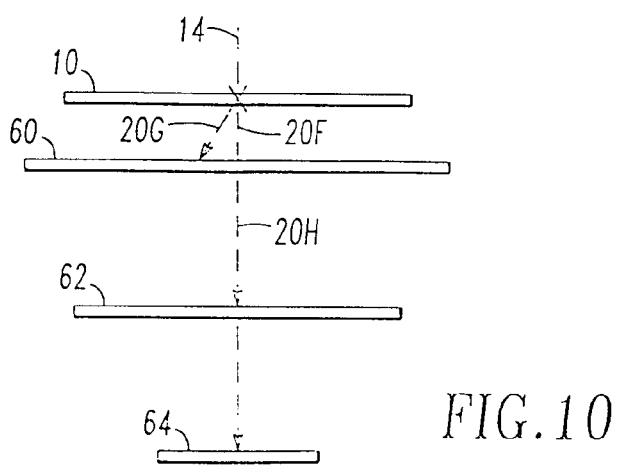
FIG. 10 is a side-view showing the present invention in use in a photolithography system.

By using the present invention, the intensity, angular frequency content, and pupil pattern shape of the exposure light used in photolithography can be controlled. Such control can improve the resolution of the image of the master pattern on the integrated circuit wafer. It has been found that for some master patterns, it is better for the light to illuminate at certain angles or ranges of angles. The homogenizer provides light at that angle while homogenizing the spatial energy provided, as well as providing control of other attributes of the exposure light. Such control can improve yields in semiconductor chip manufacturing and other areas in which photolithograhpy is used. For example, referring to FIG. 10, a light source (not shown) illuminates a homogenizer 10 (shown in side view) of the embodiment of FIG. 4 with a collimated input beam 14. The homogenizer 10 transmits a majority portion of the incident light to the mask 60 at a desired angular spread, and with a preselected intensity and spatial power distribution, wherein the preselected spatial power distribution is uniform. This transmitted portion 20f, 20g acts as the exposure light. A master, or mask, 60 is placed close to the homogenizer 10 such that there is no appreciable change in power distribution between the homogenizer 10 and the mask 60, and thus the beam is uniform at both the homogenizer 10 and the mask 60. Preferably, the mask 60 is not placed at the output plane 18 (not shown). The master 60 is illuminated with the desired exposure light 20f, 20g. The portion of the exposure light 20f, 20g that is not blocked 20h by the master 60 is transmitted by the master 60 and illuminates a lense 62. This portion 20h has the desired, preselected angular spread. The lense 62 in turn transmits the incident light 20h such that the master 60 is imaged onto the subject wafer 64 with, for example, photoresist (not shown). The lense 62 provides a desired reduction factor. This embodiment images the master 60 onto the subject wafer 64 in a desired manner, particularly a desired angular spread. Thusly, the wafer is exposed in the preselected, desired manner with an exposure light with desired and optimized attributes, and a copy is provided. In this manner, by optimizing the exposure light as desired and needed, higher yields during, for example, semi-conductor chip manufacturing can be had. The homogenizer can be used to, for example, block zero to two degrees, allow two to four degrees, and block from four degrees onward. Or, for example, a top-hat, from plus three degrees to minus three degrees can be provided by the homogenizer. Control of the angular spread and the frequency content of the transmitted light is done by design of the plateaus 50 and vias 52 of the homogenizer 10, preferably using a computer.

Preferably, the hologram 54 is a Computer Generated Hologram. Also preferably, the attributes of the Computer Generated Hologram, including angular spread, are designed and chosen using a computer. The attributes are chosen to generate a desired, predetermined illuminated target area, a desired, predetermined spatial power distribution on the output plane, and other desired attributes as needed.

In designing the invention, the designer determines the angular distribution desired. The designer designs a Fourier transform hologram, with the intensity distribution in the Fourier plane corresponding to the desired angular range. For example, the designer may choose a ring going from four degrees to seven degrees, and thus three degrees wide. This target would result in a hologram with a far-field diffraction pattern in output plane 18 of a ring. Alternatively, when used in the photolithography system of FIG. 10, the hologram's output intensity in plane 60 would be uniform, but its angular distribution in plane 60 would be between four and seven degrees. The Fourier Transform hologram has a diffractive fringe pattern, or a phase-transmittance pattern, such that the Fourier Transform of that pattern corresponds to a desired transmission over a desired angular region. How to design a Fourier transform hologram is known to those of ordinary skill in the art of this invention. Preferably, the Fourier Transform is completed on a computer.

Typically, when taking the Fast Fourier Transform, the pattern is calculated only at discrete points. Typically, the Fourier Transform hologram is replicated in order to avoid or reduce speckle. Speckle are very bright and very dark spots of light that occur due to interference in coherent systems. In the present invention, the pattern is not replicated. The preferred method to design the Fourier Transform Hologram of this invention is to use an iterative computer optimization technique, such as the IDO method mentioned above and described in *Iterative Encoding of High-Efficiency Holograms for Generation of Spot Arrays,* Optics Letters, Vol. 14, pp. 479–81, 1989 by co-inventor Feldman et al. (the disclosure of which is hereby incorporated by reference), in which the output is the Fourier Transform plane and the input is the CGH plane. In the preferred embodiment, incoherent or partially incoherent light, in addition to designing the hologram with a very large number of pixels, will avoid the occurrence of speckle. A hologram with a very large number of pixels can provide an image at the output plane that is nearly continuous. A Fourier Transform hologram has the property that each point in the output plane receives a contribution from every facet area in the hologram.

Once designed and manufactured as described above, the hologram is placed in an illumination system. When illuminated with a collimated beam of arbitrary intensity distribution, the hologram of this example transmits a ring corresponding to the desired angle in a plane relatively far from the CGH. If the beam is not collimated, then the ring will be relatively wider, with a width dependent on the precise cone angle of divergence of the incident beam. In a plane relatively very close to the CGH, there will be seen a beam with the same intensity as the beam that illuminated the CGH, but in the relatively very close plane, the beam will contain an angular spread corresponding to that of the CGH combined with that of the incident beam.

In the embodiment shown in FIG. 4, the hologram 54 is designed such that only designated target areas of the output plane are illuminated. That is, the hologram is designed such that a preselected spatial power distribution is incident upon the output plane.

Referring to FIG. 4, a collimated input beam 14 is incident upon a homogenizer 10 having a hologram 54, said hologram having an array 11 of sixteen facet areas 56 designated by dashed lines (only one of the sixteen facet areas, or facets, is shown in FIG. 4 with dashed lines, all sixteen referred to are shown in dashed lines in FIG. 7). Each of these facet areas 56 has a irregular pattern of plateaus 50 and vias 52. No two of these facet areas 56 are alike. Each of these facet areas 56 is constructed to direct any portion of a collimated optical beam 14 that is incident thereon onto a target 16 at an output plane 18. A portion of the collimated beam 14 is transmitted through each of the facet areas 56. This portion 20c, 20d has a preselected angular spread provided by the facet area 56. As described in the description of previous embodiments, this portion, shown representatively as 20c, 20d, overlap the target 16. By this overlapping, spatial energy variation that was present on the incident beam 14 is not present at the output plane 18. Thus, at the output plane, there is uniform spatial power distribution throughout the illuminated portion 16, 34 of the plane 18. This distribution or pattern forms a beam 22. The target area, the illuminated portion, is a preselected shape. The illuminated portion 16, 34 of the plane is preselected. In FIG. 4 it is a preselected circle. The illuminated portion 16, 34 of the plane does not have undesired intensity variations from sharp edges or breaks between facets because such sharp edges or breaks have been removed by the use of irregularly patterned facets with irregularly patterned plateaus and vias.

In the present invention, the designer can select uniform magnitudes of spatial power for the illuminated areas of the output plane. Also, in the present invention, the designer can select different magnitudes of spatial power for different illuminated areas of the output plane. For example, in FIG. 8, the designer could select a spatial power level of magnitude 1 (arbitrary units) for the upper half of the illuminated 34 circle 16, and a spatial power level of magnitude 1.5 (arbitrary units) for the lower half of the illuminated 34 circle 16. Thus, the spatial power distribution includes both the shape of the illumination pattern on the output plane and the spatial power distribution within the illuminated portion. The spatial power distribution selected, though, is homogenized and is therefore the power distribution remains unaltered despite changes in the input beam power distribution. The spatial power distribution selected by the designer will depend upon the application at hand.

A phase-transmittance pattern is a mathematical description of the diffractive fringe pattern. That is, the physical diffractive fringe pattern seen, for example, in FIG. 7 can be described mathematically, and a phase-transmittance pattern describes it mathematically. Persons of ordinary skill in the art would understand phase-transmittance patterns and their mathematical relation to fringes and diffractive fringe patterns.

Those of ordinary skill in the art of this invention will know how to take the Fourier Transform of a phase-transmittance pattern. The Fourier Transform hologram has a diffractive fringe pattern, or a phase-transmittance pattern, such that the Fourier Transform of that pattern corresponds to a desired transmission over a desired angular region. The Fourier Transform is preferably completed using a computer.

Binary phase elements are elements used in construction or manufacture of optical elements such as holograms. Persons of ordinary skill in the art of the present invention will be familiar with binary phase elements. U.S. Pat. No. 4,895,790 discloses the construction of such binary phase elements and the disclosure of that patent is incorporated herein.

Changes in construction will occur to those skilled in the art and various apparently different modifications and embodiments may be made without departing from the invention. The material set forth in the foregoing description and accompanying drawing is offered by way of illustration only. It is therefor intended that the forgoing description be regarded as illustrative rather than limiting and that the invention be only limited by the scope of the claims.

We claim:

1. A diffusing element for use as a reticle in a lithographic system, the diffusing element comprising:

a substrate having a lithographically created structure on its surface, which structure converts an input beam illuminating at least part of said structure into an output beam having a preselected energy distribution in an output plane of the lithographic system, wherein substantially all of said output beam is non-orthogonally incident on the output plane, the energy distribution of the output beam being substantially independent of position and spatial energy distribution of the input beam, both diffusing and shaping of the output beam being provided by said structure.

2. The diffusing element of claim 1, wherein said structure substantially eliminates the output beam incident on a center of the output plane.

3. The diffusing element of claim 1, wherein said structure forms a ring in the output plane.

4. The diffusing element of claim 1, wherein the energy distribution over the angular distribution of the output beam is substantially uniform.

5. The diffusing element of claim 1, wherein the diffusing and shaping are provided by a single surface.

* * * * *